United States Patent
Kumar et al.

(10) Patent No.: US 12,424,823 B2
(45) Date of Patent: Sep. 23, 2025

(54) MULTI-WAVELENGTH DISTRIBUTED FEEDBACK LASER

(71) Applicant: Intel Corporation, Santa Clara, CA (US)

(72) Inventors: Ranjeet Kumar, Milpitas, CA (US); Haisheng Rong, Pleasanton, CA (US); Jie Sun, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 965 days.

(21) Appl. No.: 17/337,479

(22) Filed: Jun. 3, 2021

(65) Prior Publication Data

US 2021/0288470 A1    Sep. 16, 2021

(51) Int. Cl.
*H01S 5/12* (2021.01)
*G02B 6/122* (2006.01)
*H01S 5/042* (2006.01)
*H01S 5/10* (2021.01)

(52) U.S. Cl.
CPC .......... *H01S 5/1246* (2013.01); *G02B 6/1228* (2013.01); *H01S 5/04256* (2019.08); *H01S 5/1014* (2013.01)

(58) Field of Classification Search
CPC .... H01S 5/1246; H01S 5/1064; H01S 5/1092; H01S 5/1014; H01S 5/04256; H01S 5/026; G02B 6/12; G02B 6/1228; G02F 1/011
See application file for complete search history.

(56) References Cited

U.S. PATENT DOCUMENTS

| | | | |
|---|---|---|---|
| 10,012,797 B1 * | 7/2018 | Nagarajan | H01S 5/1221 |
| 10,727,640 B2 | 7/2020 | Sun et al. | |
| 2011/0299561 A1 * | 12/2011 | Akiyama | H01S 5/02325 |
| | | | 385/10 |
| 2021/0006044 A1 | 1/2021 | Hong et al. | |
| 2021/0057880 A1 | 2/2021 | Mehta et al. | |
| 2024/0039240 A1 * | 2/2024 | Morrison | H01S 5/04256 |

OTHER PUBLICATIONS

Innolume GmbH, LD-310-COMB-8 Fiber coupled Comb Laser Diode @ 1310nm, 4 pages.
Hao Li et al., A 3-D-Integrated Silicon Photonic Microring-Based 112-GB/s PAM-4 Transmitter With Nonlinear Equalization and Thermal Control, IEEE Journal of Solid-State Circuits, vol. 56, No. 1, Jan. 2021; pp. 19-29.
Xu Wang et al, Precise control of the coupling coefficient through destructive interference in silicon waveguide Bragg gratings, Optic Letters, vol. 39, No. 19, Oct. 1, 2014, pp. 5519-5522.

* cited by examiner

*Primary Examiner* — Michael P Mooney
(74) *Attorney, Agent, or Firm* — Essential Patents Group, LLP (57) ABSTRACT

In one embodiment, a distributed feedback laser includes a laser comprising a waveguide, the waveguide having a variable width from a first end to a second end, the laser to generate optical energy of a plurality of lasing wavelengths. Other embodiments are described and claimed.

20 Claims, 6 Drawing Sheets

MULTI-WAVELENGTH DISTRIBUTED FEEDBACK LASER

BACKGROUND

In the field of optical communication, high-speed communication in excess of 100 Gigabits per second (Gbps) per channel using silicon photonics has been recently demonstrated. However with increased demand in data rates, this level may not be sufficient. In fact, silicon photonics is entering a new phase with on-board optics. This demand of increased data rates can be achieved, in part, using dense wavelength division multiplexing (DWDM). In this case, a given wavelength/channel can still carry 100 Gbps, but the aggregate data rate can be much higher, depending on the number of wavelengths used in the system. Yet there are issues as to manufacturing, including size, power and so forth.

DETAILED DESCRIPTION

In various embodiments, a multi-wavelength laser is provided that can enable dense wavelength division multiplexing (DWDM)-based systems, without using a multiplexer. The absence of a multiplexer enables a photonic circuit's footprint to be compact and energy efficient. In some embodiments the laser may be implemented as a III-V/Silicon (Si) hybrid multi-wavelength laser that realizes: (1) multi-wavelength generation of optical energy from an integrated single laser; (2) removal of fabrication-imposed minimum channel spacing between lasing wavelengths via a tapered waveguide design; and (3) multiplexer-free design for compact and power efficient systems.

With a multi-wavelength laser in accordance with embodiments, on-board optics can enable higher aggregate input/output (I/O) data rates through DWDM. A single laser emitting multiple wavelengths may have a channel spacing of, e.g., 100 gigahertz (GHz) or 200 GHz. Embodiments also may equalize power across different channels. Still further, wavelength spacing may be configured to remain constant over temperature and laser bias current.

In contrast, conventional implementations use a laser array that has N independent single wavelength lasers that are multiplexed to provide N wavelength laser sources. Such a conventional implementation leads to large channel spacing variations, and requires a multiplexer to combine all the wavelengths. This configuration results in loss and consumes a larger footprint. In addition, since this laser source requires pumping multiple lasers above a threshold, it is less energy efficient. For instance, 4 individual lasers each may consume approximately 14 milliWatts (mW), with a total power consumption of 4*14 mW=56 mW. Instead a 4-wavelength laser implementation as described herein may consume approximately 17 mW to cross the threshold for all four wavelengths.

Other conventional lasers include comb lasers such as a Fabry-Perot-based multi-wavelength laser. However in these designs, the number of lasing wavelengths and power uniformity of each wavelength are not controlled, resulting in power wastage. This power wastage can be present in conventional lasers, as there is not sufficient control over the number of wavelengths generated. For example, even where only four wavelengths are desired for a given application, a conventional laser typically wastes power by generating more than 4 wavelengths. In contrast with embodiments, if a given application uses four wavelengths, a laser is designed that can generate only four wavelengths.

Communication speed and latency are major considerations in data centers, particularly as the volumes and speed of data can exceed capacity of traditional copper-based electrical interconnects, and thus fiberoptic interconnects are often implemented. Fiberoptic interconnects are especially useful in longer data paths, such as between a rack and a spine switch in a leaf/spine network, or in other locations.

In fiberoptic communication, communication density may be specified in terms of Gbps, per wavelength. For example, data modulated onto a first wavelength may have a maximum speed of 25 Gbps. To increase overall communication density of the fiberoptic interconnect, information may be encoded onto other wavelengths. For example, if four different wavelengths have data modulated onto them, and each has a speed of 25 Gbps, then the fiberoptic interconnect has an overall effective communication speed of 100 Gbps.

Traditionally, four different lasers that generate four different frequencies with four corresponding wavelengths are used. Data may then be modulated onto each of the four wavelengths output from the four lasers. Finally, the four modulated signals are frequency multiplexed together and transmitted via a fiberoptic interconnect. While this configuration works well, it also consumes a large amount of semiconductor area.

To realize a multi-wavelength laser that consumes less surface area, embodiments provide a single laser to communicate a plurality of wavelengths through multiple cascaded-cavities. In this way, multiple lasers can be avoided, and further a multiplexer is not needed. In an illustrative example, the single laser uses a Bragg filter to generate a laser with four wavelengths available for data transmission. A conventional Bragg filter has slits that are spaced corresponding to one-quarter wavelength of the selected wavelength to reflect the selected wavelength, while allowing all other wavelengths to pass through. By manufacturing a multimode laser in accordance with an embodiment, a system designer can realize a multimode communication laser capable of high communication density, with a reduced silicon footprint on an integrated circuit.

Figure 1:
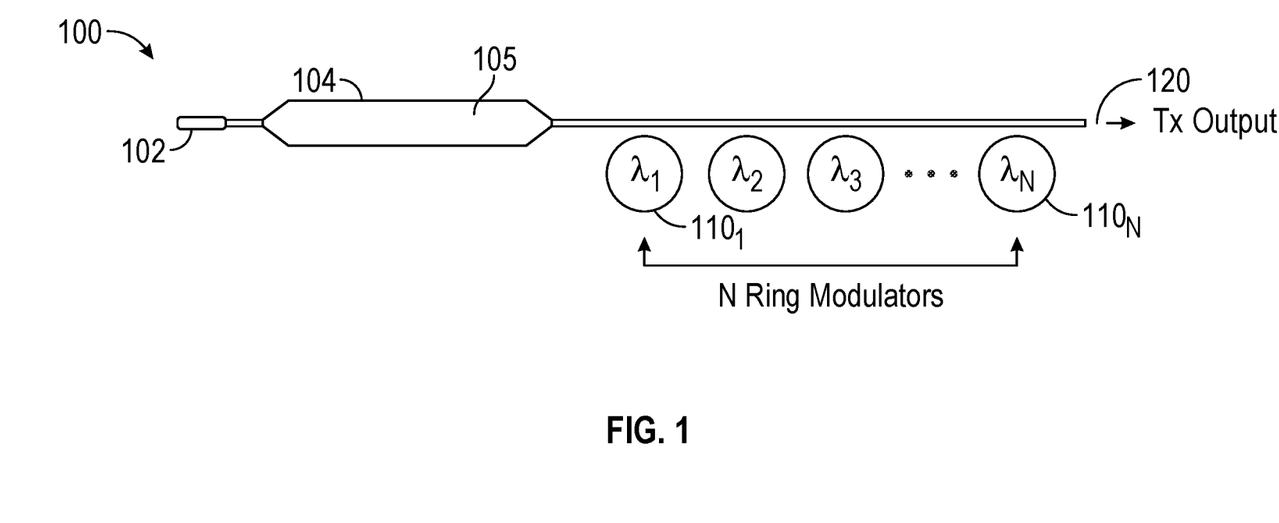
FIG. 1 is a block diagram of a multi-wavelength distributed feedback (DFB) laser in accordance with an embodiment.

FIG. 1 is a block diagram of a multi-wavelength distributed feedback (DFB) laser 100 in accordance with an embodiment. As shown multi-wavelength DFB laser 100 can generate multiple wavelengths in a single laser 104, thus saving chip area and eliminating the multiplexer. This also alleviates requirements for precise wavelength, therefore enabling low-cost, on-chip DWDM transmission.

In FIG. 1, laser 104 couples to a backside termination 102 that absorbs light. Understand that laser 104 has a grating 105 with a given grating pattern, details of which are described herein. Suffice to say, with embodiments herein appropriate design and manufacture of the grating and its properties may enable the multi-wavelength lasing modes realized herein.

As shown, a plurality of modulators $110_{1-N}$ are used to modulate data onto the carrier lasers provided by laser 104. In an embodiment, modulators 110 may be implemented as ring modulators that modulate data onto carrier wavelengths. Ring modulators 110 are wavelength-selective modulators, and are a relatively small type of modulator. The use of multi-wavelength laser 104 and ring modulators 110 may eliminate the need for a multiplexer on the transmit end of a system. Instead as shown, modulators 110 may directly couple to an optical interconnect 120 (e.g., an optical fiber), without interposition of a multiplexer or other selection circuitry. This enables a compact DWDM transmitter with a minimal number of components, which saves expensive chip area, especially where a larger number of wavelengths are used.

Laser 104 constructed according to an embodiment thus generates multiple wavelengths in the single laser. Furthermore, the position of the quarter-wave phase shifter in each underlying grating can be offset from each other grating to avoid mode competitions. In other words, peak power for each selected wavelength is delivered at a different point in the laser gain section. Because of the spatial offset of the phase shifts, the optical power of each wavelength can be individually adjusted using segmented electrodes, as will be described further below.

Figure 2:
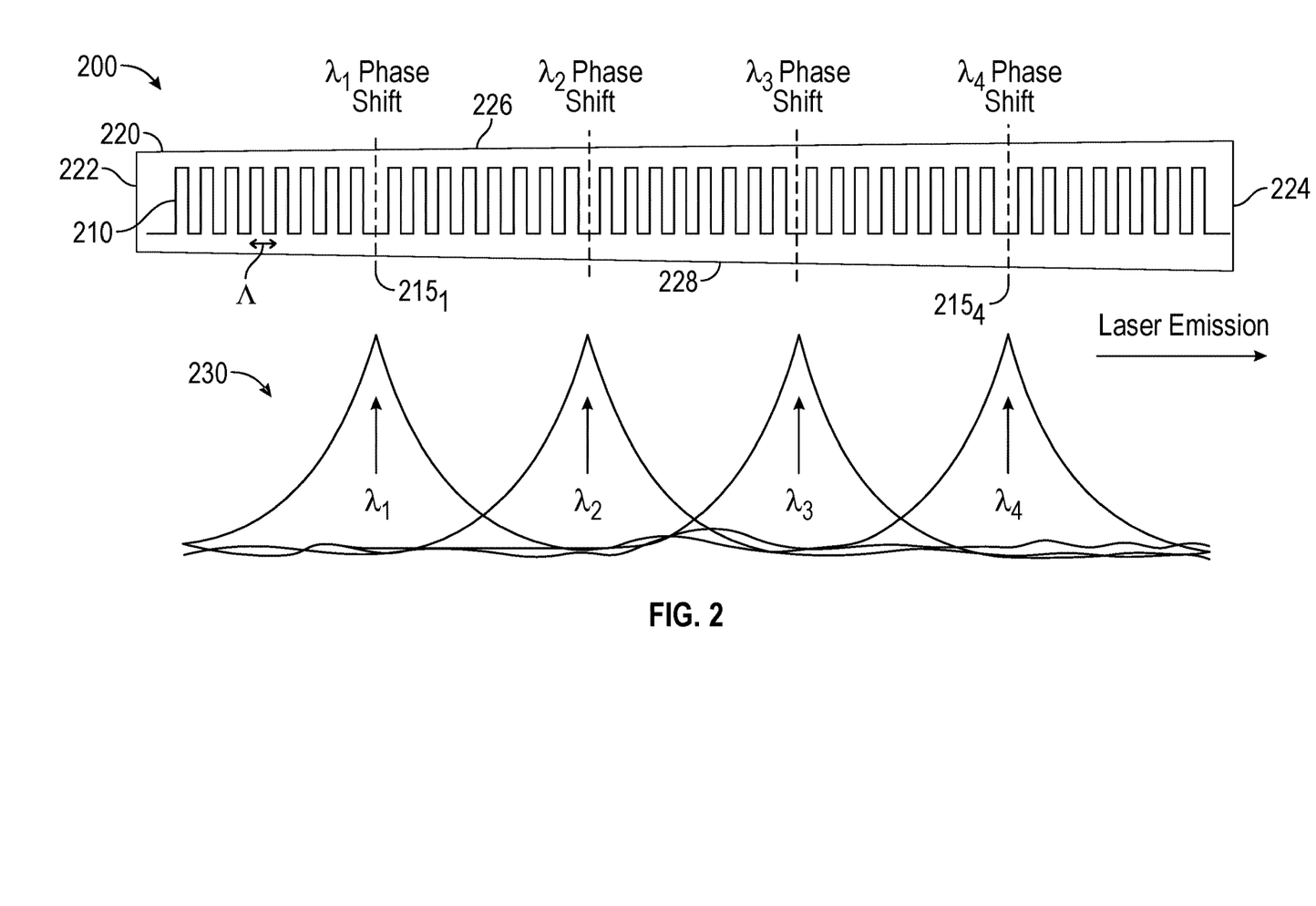
FIG. 2 is an illustration of a multi-wavelength laser in accordance with an embodiment.

Referring now to FIG. 2, shown is an illustration of a multi-wavelength laser 200 in accordance with an embodiment. In the embodiment of FIG. 2, laser 200 is a four-wavelength laser; understand of course that more or fewer wavelengths can be implemented in a laser of an embodiment.

Laser 200 may be configured to have a channel spacing in the range of 100 GHz (wavelength (lambda or λ)=0.6 nanometers (nm)). Generation of multiple wavelengths requires supporting multiple laser cavities, all at once, which itself is a non-trivial task, and a laser with channel spacing close to 100 GHz is even more challenging. The channel spacing limitation mostly results from the laser grating's fabrication constraints. Each wavelength, which may be referred to as any of the symbol λ, as a channel (CH), as a frequency, as a line or lasing line (and all of these terms may be used interchangeably herein), may be used to encode data that is to be optically transmitted.

The lasing wavelength λ of a DFB laser is defined by Equation 1, below, where $\wedge$ is the grating pitch and $n_{eff}$ is the effective refractive index of the lasing mode. $\lambda=2n_{eff}\wedge$ [Eq. 1].

For a single wavelength DFB laser, typically both front and backside gratings have the same pitch and $n_{eff}$, and there is a λ/4 phase shift in the middle.

In order for a DFB to generate many wavelengths, the relationship between λ, $\wedge$, and $n_{eff}$ is to be satisfied for all the lasing wavelengths. In conventional lasers, the change in lasing wavelength may be primarily controlled using the pitch of the grating, and the difference in lasing wavelengths can be controlled using the difference in the pitch. Hence, the channel spacing may be limited to the resolution of fabricated laser pitch. Channel spacing of 100 GHz would require difference in pitch to be about 100 picometers (pm), which can be challenging.

With continued reference to FIG. 2, laser 200 is formed of a waveguide 220 having a grating 210 that extends from a first end 222 of waveguide 220 to a second end 224 of waveguide 220. In an embodiment, first end 222 may be a laser back side and second end 224 may be a laser front side. As further shown, waveguide 220 is further defined by a first side 226 and a second side 228. In an embodiment, the width of a waveguide may be on the order of approximately 1 micron and the length may be on the order of approximately 1000 microns; of course other sizes are possible.

Note that grating 210 has a constant grating pitch of $\wedge$. In certain embodiments, pitch $\wedge$ is not relied on to define a lasing wavelength, since the grating pitch remains constant. Instead to control lasing wavelength in embodiments, the effective refractive index ($n_{eff}$) can be changed by changing a width of waveguide 220. More specifically, the refractive index $n_{eff}$ may be changed by changing the width of waveguide 220, e.g., in a linear fashion along waveguide 220.

As one example width may vary linearly, and can change such that a width at the wider end may exceed the width at the narrower end based at least in part on channel spacing. In this way, a well-controlled wavelength spacing may be realized as a function of the slope of the width of waveguide 220. In an embodiment, the change in grating kappa, due to the change in width, can be compensated by controlling the grating kappa along laser 200.

With further reference to FIG. 2, there are a plurality of phase shift locations $215_{1-4}$ corresponding to the four lasing wavelengths $\lambda_1$-$\lambda_4$, also shown in FIG. 2. Note that a portion of grating pattern 210 to a left side (in the illustration of FIG. 2) of phase shift location $215_1$ may be a back grating reflector for the corresponding wavelength. And in turn, a portion of grating pattern 210 to a right side (in the illustration of FIG. 2) of phase shift location $215_1$ may be a front grating reflector for the corresponding wavelength. This front grating reflector portion also may act as a back grating reflector for the corresponding wavelength of phase shift location 2152.

Understand while in the embodiment of FIG. 2, four such phase shift locations are illustrated for the representative four-wavelength laser, embodiments are not limited in this regard and more or fewer such phase shift locations may be present. More generally, N phase shift locations may be provided in a given laser to provide N lasing wavelengths with significantly low overlap between neighboring lasing modes.

FIG. 2 further shows a corresponding simulated intensity distribution within laser 200, with peak intensities at the four phase shift locations.

Figure 3:
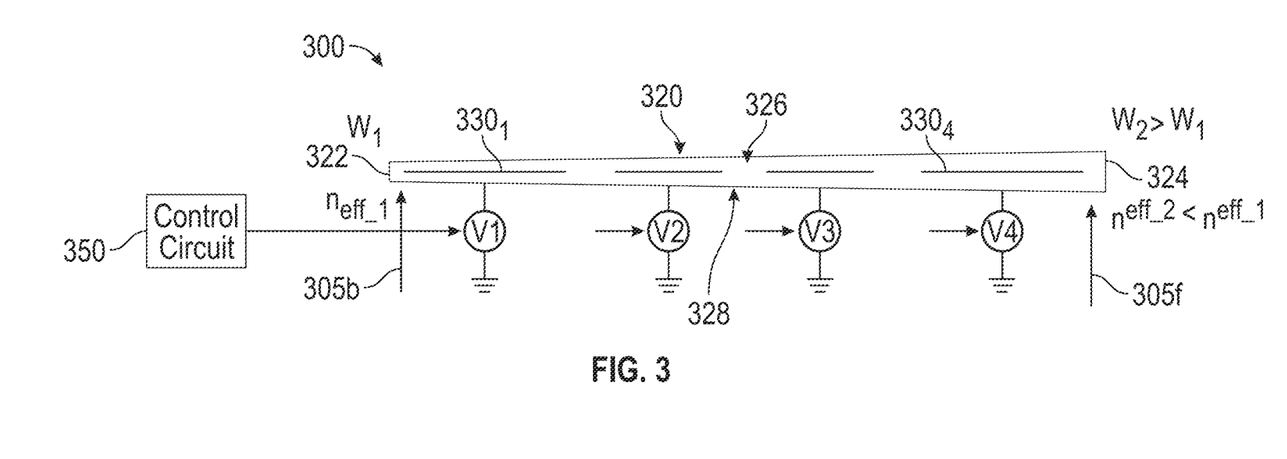
FIG. 3 is a schematic diagram of a multiple wavelength laser in accordance with an embodiment.

Referring now to FIG. 3, shown is a schematic diagram of a multiple wavelength laser in accordance with an embodiment. As shown in FIG. 3, laser 300 includes a waveguide 320 having a tapered width to control channel spacing. Waveguide 320 has a first end 322 and a second end 324. In an embodiment, first end 322 may be a laser back side and second end 324 may be a laser front side. As further shown, waveguide 320 is further defined by a first side 326 and a second side 328.

More specifically as shown in FIG. 3, waveguide width varies (e.g., linearly, such as shown in FIG. 3) from laser back side $305_b$ having a width W1 to laser front side $305f$ having a width W2, where W2>W1. In one embodiment the difference may be on the order of 100 nm, and may vary depending on channel spacing. In the embodiment of FIG. 3, waveguide width varies from a smallest width at back side $305b$ to a widest width at front side $305f$. Of course in other embodiments understand that waveguide width may vary in the opposite manner. Still further, in other implementations it may be possible to vary the waveguide width to increase and decrease across a length of waveguide 320. And in different embodiments it may be possible to design a laser to emit light from the left side, right side, or both, by varying the grating strength along the laser.

Still with reference to FIG. 3, a plurality of individual or segmented electrodes may be provided for the different wavelengths. Specifically as shown, an electrode 330 (which may be an anode electrode) is implemented as a plurality of individual electrodes $330_1$-$330_4$, which may be adapted on a top surface of waveguide 300 (and on top of one or more intervening layers, such as a III-V material, in some cases). Electrodes 330 may have different sizes, depending on the position of phase shift locations. By way of multiple electrodes 330, power of individual wavelengths may be independently controlled. Driving independent electrodes with different injection currents balances the output power of the wavelengths.

In the embodiment of FIG. 3, a control circuit 350, which may be present on a separate IC such as a power IC, may send control signals to cause independent voltages V1-V4 to be provided to electrodes 330. Note in the illustration of FIG. 3, only anode electrodes are shown; understand that cathode electrodes may be forced to ground. The separation of segmented electrodes can be precisely fabricated using proton implantation with lithographically defined registration accuracy, in an embodiment.

In this way, power equalization may be realized across different channels, since independent control may be provided to the individual electrodes to control output power for each wavelength, resulting in power equalization across different wavelengths or channels. In embodiments, a laser having multiple laser cavities (multiple cascaded cavities) for individual wavelengths can be designed to be equal in length, but they can be of different lengths, which can equalize the laser power. A laser in accordance with an embodiment can be used in series with a saturated III-V/Si hybrid semiconductor optical amplifier (SOA) to equalize the powers of different channels. In this way, laser power imbalances can be reduced significantly.

Figure 4:
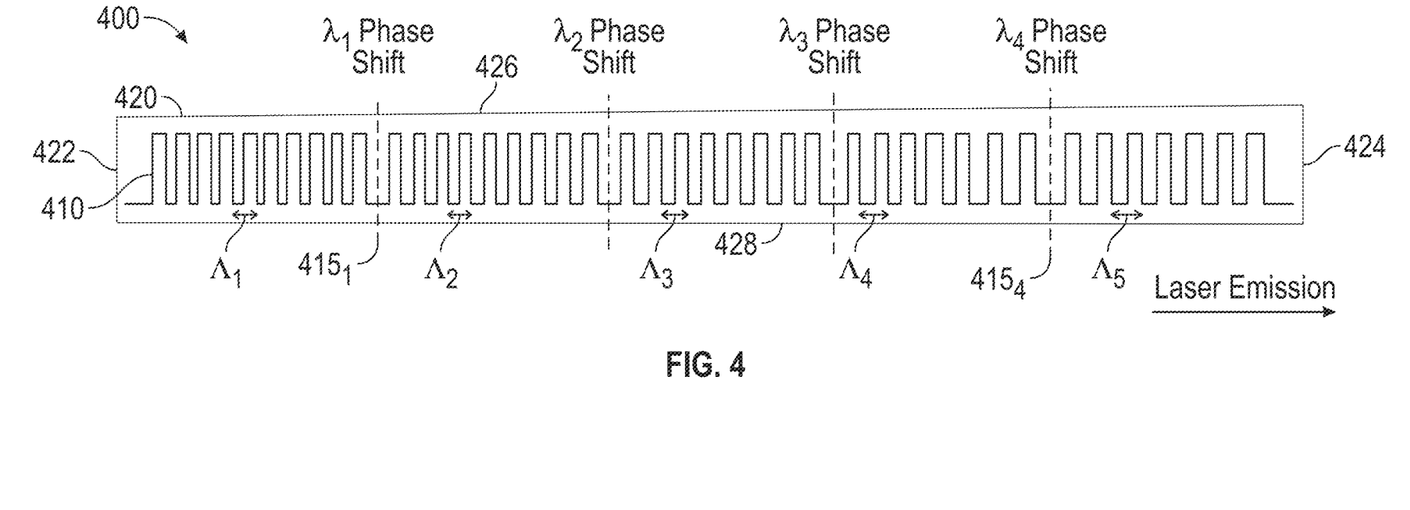
FIG. 4 is an illustration of a multi-wavelength laser in accordance with another embodiment.

In another embodiment, a laser can implement gratings having different pitches, while keeping waveguide width constant. Referring now to FIG. 4, shown is an illustration of a multi-wavelength laser 400 in accordance with another embodiment. In the embodiment of FIG. 4, laser 400 is a four-wavelength laser; understand of course that more or fewer wavelengths can be implemented in a laser of an embodiment.

Laser 400 may be generally similarly configured the same as laser 200 of FIG. 2 (and thus reference numerals generally refer to the same components, albeit of the "400" series in place of the "200" series of FIG. 2). However here, there is no variable waveguide width in this implementation. As illustrated, laser 400 is formed of a waveguide 420 having a grating 410 that extends from a first end 422 of waveguide 420 to a second end 424 of waveguide 420. As further shown, waveguide 420 is further defined by a first side 426 and a second side 428.

In the embodiment of FIG. 4, grating 410 has a variable grating pitch across a length of waveguide 420. In the embodiment of FIG. 4, 5 different grating pitches $\wedge_{1-5}$ are present to effect multiple lasing wavelengths. Thus there are a plurality of phase shift locations $415_{1-4}$ corresponding to four lasing wavelengths $\lambda_1$-$\lambda_4$ realized by these different grating pitches. Understand while in the embodiment of FIG. 4, four such phase shift locations are illustrated for the representative four-wavelength laser, more or fewer such phase shift locations may be present.

Figure 5A:
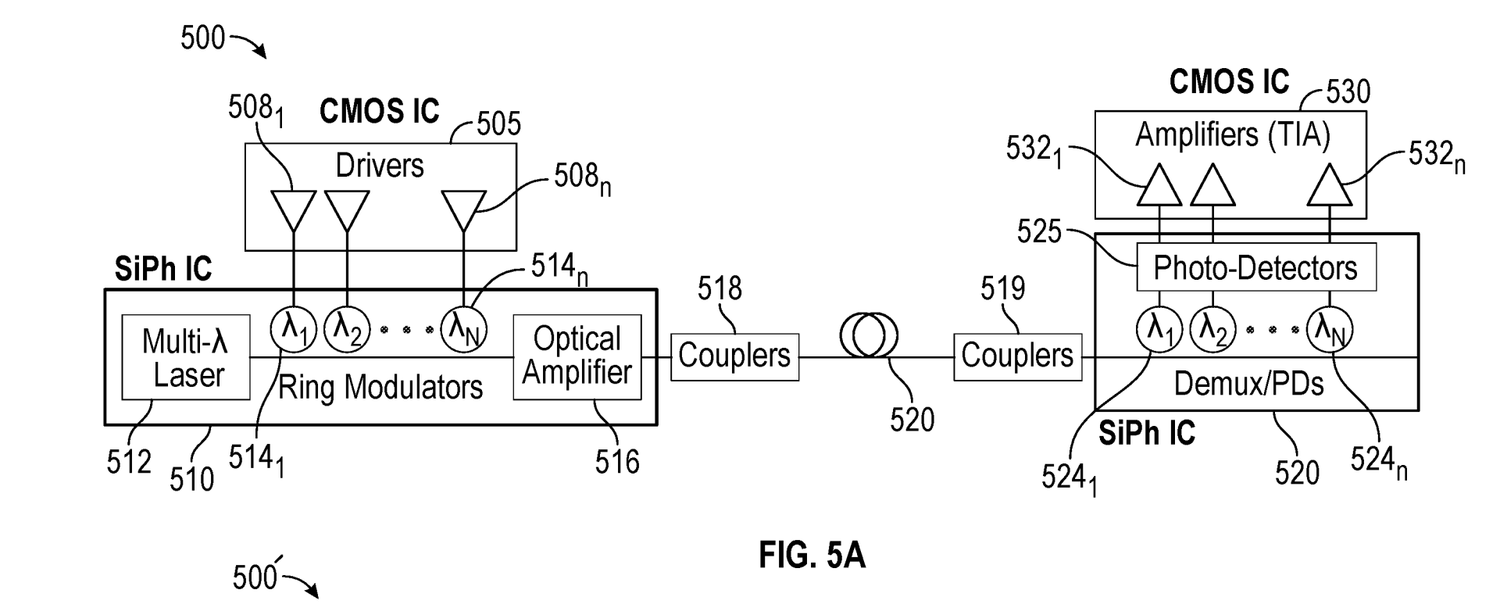
FIG. 5A is a block diagram of a system in accordance with an embodiment.

Referring now to FIG. 5A, shown is a block diagram of a system in accordance with an embodiment. As shown in FIG. 5A, system 500 may be any type of computing system, ranging from a small portable device to larger devices such as desktop computers, server computers or so forth.

In the high level shown in FIG. 5A, system 500 includes various electrical ICs and multiple photonic ICs. Specifically as shown, a first electrical IC 505, which may be implemented as a CMOS IC, includes a plurality of drivers $508_{1-n}$. Although embodiments are not limited in this regard, assume that IC 500 is a SoC or other processor. Drivers 508 may be implemented to receive incoming data or other information from a source circuit within IC 505, such as a processing core or other source circuit. In turn, drivers 508 communicate information electrically to a plurality of ring modulators $514_{1-n}$, which are adapted on a first silicon photonic (SiPh) IC 510. Photonic IC 510 includes transmitter circuitry including a multi-wavelength DFB laser 512 in accordance with an embodiment, to efficiently generate optical energy of multiple wavelengths.

Ring modulators 514 each may be configured to modulate incoming information onto a carrier optical signal of a given wavelength. In turn, the modulated optical signals are amplified in an optical amplifier 516, which may be implemented as a semiconductor optical amplifier (SOA).

Still with reference to FIG. 5A, the information communicated from IC 510 may be coupled via one or more couplers 518 to an optical interconnect 520, shown as one or more optical fibers. In turn, optical interconnect 520 couples, via another one or more couplers 519, to another SiPh IC 520, which in this illustration includes receiver circuitry. Specifically as shown, a plurality of demultiplexers $524_{1-n}$ are provided to receive the modulated optical information of a given wavelength, which may then be converted in photodetectors 525 to electrical information that in turn is provided to another electrical IC 530. In an embodiment, second electrical IC 530, which may be implemented as a CMOS IC, includes a plurality of transimpedance amplifiers $532_{1-n}$. Although embodiments are not limited in this regard, IC 530 may be another SoC, a memory for IC 510 or another such electrical circuit. Understand while shown at this high level in the embodiment of FIG. 5, many variations and alternatives are possible. For example, an additional power IC (which may include a control circuit such as control circuit 350 of FIG. 3) may be present that includes circuitry to control lasers and SOAs of the SiPh ICs. Of course this control circuitry instead may be present in an electrical IC (such as CMOS IC 505).

Figure 5B:
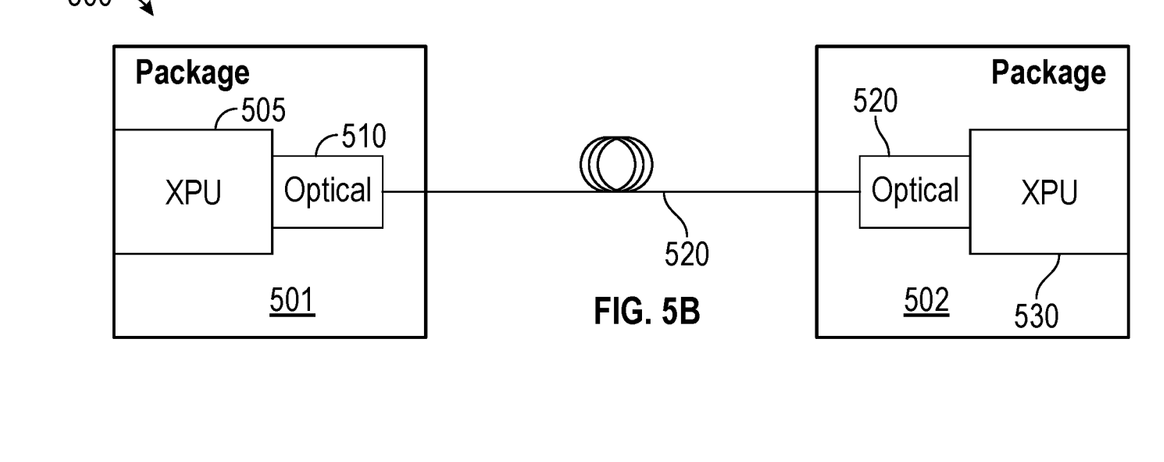
FIG. 5B is a block diagram of a system in accordance with an embodiment.

Referring now to FIG. 5B, shown is a block diagram of a system in accordance with another embodiment. As shown in FIG. 5B, system 500' may generally be configured the same as system 500 of FIG. 5A, and thus same numbering applies. In this implementation however, electrical and optical ICs are implemented in corresponding packages 501, 502 that are coupled via optical interconnect 520. Note that in various implementations, different manners of packaging CMOS and SiPh ICs may be realized, including commonly packaging multiple die of these ICs into a common package, such that a single package includes one or more CMOS die and one or more SiPh die.

Figure 6:
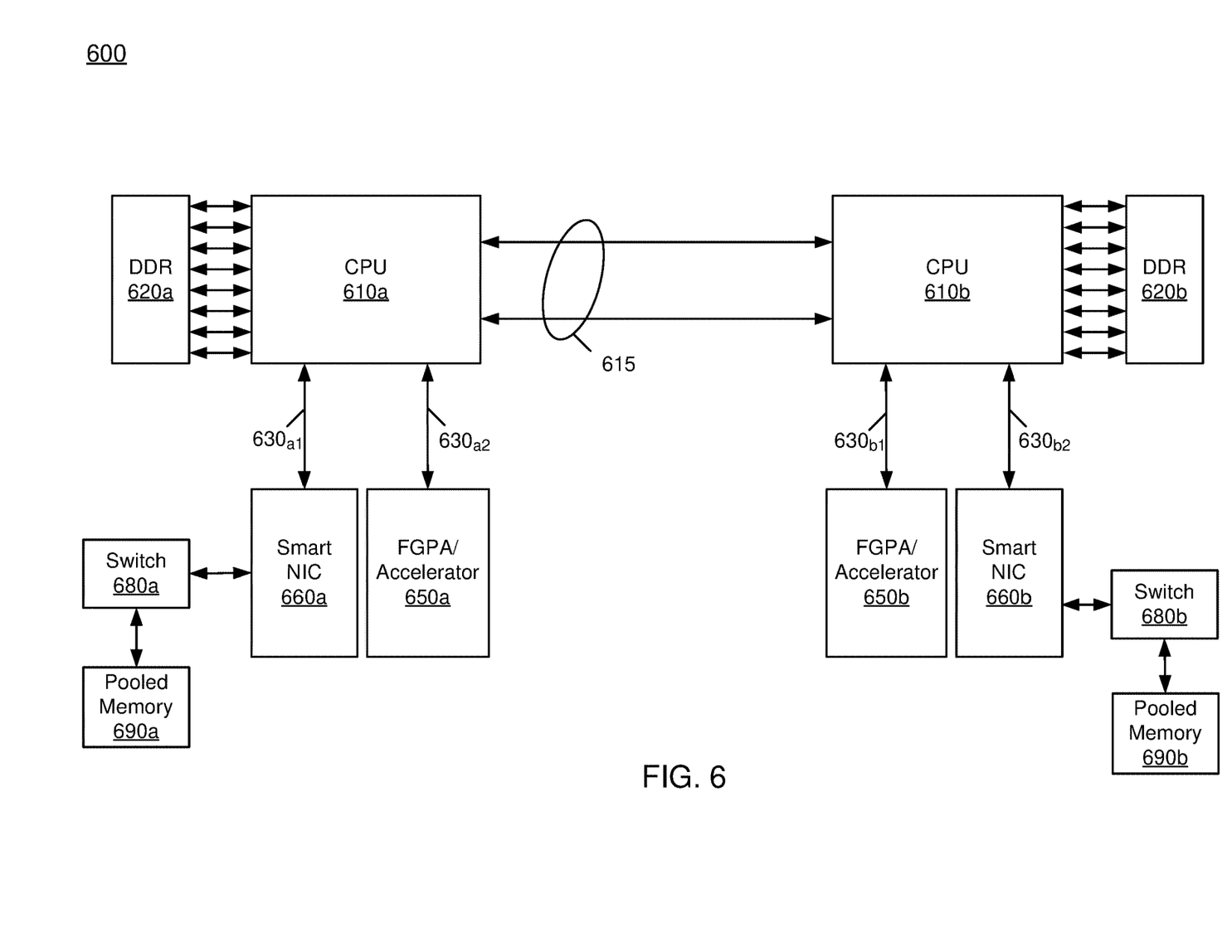
FIG. 6 is a block diagram of a system in accordance with another embodiment.

Referring now to FIG. 6, shown is a block diagram of a system in accordance with another embodiment. As shown in FIG. 6, a system 600 may be any type of computing device, and in one embodiment may be a server system such as an edge platform. In the embodiment of FIG. 6, system 600 includes multiple CPUs 610a,b that in turn couple to respective system memories 620a,b which in embodiments may be implemented as double data rate (DDR) memory. Note that CPUs 610 may couple together via an interconnect system 615, which in an embodiment can be an optical interconnect that communicates with optical circuitry (which may be included in or coupled to CPUs 610) including lasers having waveguides and gratings as described herein.

To enable coherent accelerator devices and/or smart adapter devices to couple to CPUs 610 by way of potentially multiple communication protocols, a plurality of interconnects 630a1-b2 may be present. In an embodiment, each interconnect 630 may be a given instance of a Compute Express Link (CXL) interconnect.

In the embodiment shown, respective CPUs 610 couple to corresponding field programmable gate arrays (FPGAs)/accelerator devices 650a,b (which may include graphics processing units (GPUs), in one embodiment. In addition CPUs 610 also couple to smart network interface circuit (NIC) devices 660a,b. In turn, smart NIC devices 660a,b couple to switches 680a,b that in turn couple to a pooled memory 690a,b such as a persistent memory.

Figure 7:
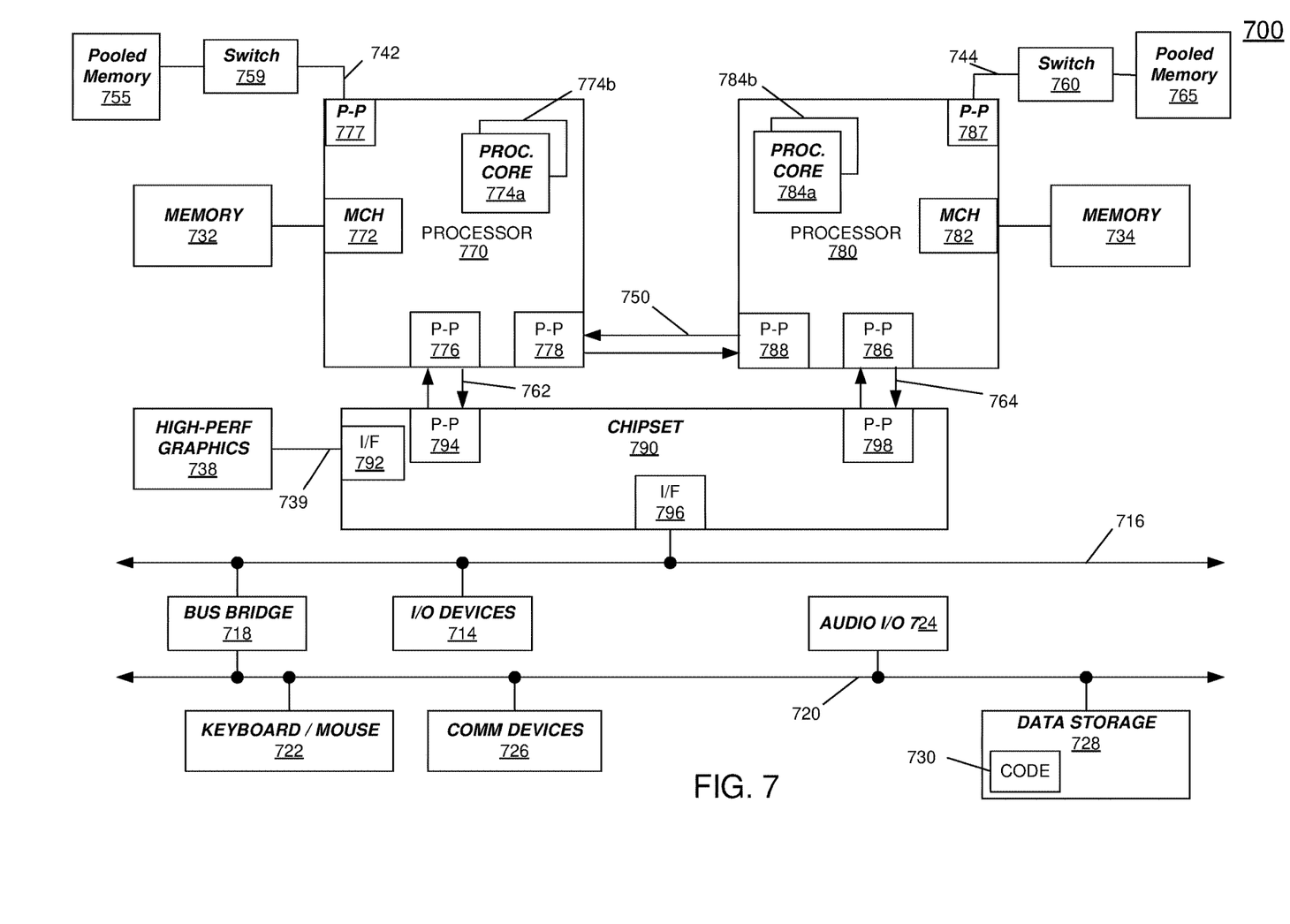
FIG. 7 is a block diagram of a system in accordance with another embodiment.

Referring now to FIG. 7, shown is a block diagram of a system in accordance with another embodiment such as an edge platform. As shown in FIG. 7, multiprocessor system 700 includes a first processor 770 and a second processor 780 coupled via an interconnect 750, which in an embodiment can be an optical interconnect that communicates with optical circuitry (which may be included in or coupled to processors 770) including lasers having waveguides and gratings as described herein. As shown in FIG. 7, each of processors 770 and 780 may be many core processors including representative first and second processor cores (i.e., processor cores 774a and 774b and processor cores 784a and 784b).

In the embodiment of FIG. 7, processors 770 and 780 further include point-to point interconnects 777 and 787, which couple via interconnects 742 and 744 (which may be CXL buses) to switches 759 and 760. In turn, switches 759, 760 couple to pooled memories 755 and 765.

Still referring to FIG. 7, first processor 770 further includes a memory controller hub (MCH) 772 and point-to-point (P-P) interfaces 776 and 778. Similarly, second processor 780 includes a MCH 782 and P-P interfaces 786 and 788. As shown in FIG. 7, MCH's 772 and 782 couple the processors to respective memories, namely a memory 732 and a memory 734, which may be portions of system memory (e.g., DRAM) locally attached to the respective processors. First processor 770 and second processor 780 may be coupled to a chipset 790 via P-P interconnects 776 and 786, respectively. As shown in FIG. 7, chipset 790 includes P-P interfaces 794 and 798.

Furthermore, chipset 790 includes an interface 792 to couple chipset 790 with a high performance graphics engine 738, by a P-P interconnect 739. As shown in FIG. 7, various input/output (I/O) devices 714 may be coupled to first bus 716, along with a bus bridge 718 which couples first bus 716 to a second bus 720. Various devices may be coupled to second bus 720 including, for example, a keyboard/mouse 722, communication devices 726 and a data storage unit 728 such as a disk drive or other mass storage device which may include code 730, in one embodiment. Further, an audio I/O 724 may be coupled to second bus 720.

The following examples pertain to further embodiments.

In one example, an apparatus includes a laser comprising a waveguide, the waveguide having a variable width from a first end to a second end, the laser to generate optical energy of a plurality of lasing wavelengths.

In an example, the waveguide comprises a grating pattern, the grating pattern comprising a plurality of phase shift locations, each of the plurality of phase shift locations corresponding to a lasing wavelength.

In an example, the grating pattern comprises a constant grating pitch.

In an example, the variable width is to cause the waveguide to have a variable effective refractive index to effect the plurality of lasing wavelengths.

In an example, the variable width comprises a linearly tapered width from the first end to the second end.

In an example, the apparatus further comprises a plurality of electrodes adjacent a first side of the waveguide, where each of the plurality of electrodes is to be independently controlled.

In an example, the apparatus further comprises a control circuit to cause an independent voltage to be provided to each of the plurality of electrodes.

In an example, the waveguide comprises: a first portion having a first grating reflector and a second grating reflector, where the first grating reflector has a first center wavelength and the second grating reflector has a second center wavelength different than the first center wavelength; and a second portion having the second grating reflector and a third grating reflector, where the third grating reflector has a third center wavelength different than the second center wavelength.

In an example, the first grating reflector overlaps with at least a portion of the second grating reflector.

In an example, the apparatus further comprises: a plurality of modulators, each of the plurality of modulators to modulate one of the plurality of lasing wavelengths with data; and a semiconductor optical amplifier coupled to the plurality of modulators to amplify the modulated plurality of lasing wavelengths.

In another example, an apparatus comprises a laser comprising a waveguide, the waveguide extending from a first end to a second end and comprising a grating pattern having a plurality of phase shift locations, each of the plurality of phase shift locations corresponding to a lasing wavelength, the laser to generate optical energy of a plurality of lasing wavelengths.

In an example, the waveguide has a substantially constant width from the first end to the second end.

In an example, a first portion of the grating pattern adjacent a first side of a first phase shift location has a first grating pitch, and a second portion of the grating pattern adjacent a second side of the first phase shift location has a second grating pitch different than the first grating pitch.

In an example, the first portion of the grating pattern comprises a front grating reflector for the first phase shift location and further comprises a back grating reflector for a second phase shift location.

In another example, a system comprises: a first integrated circuit comprising at least one processor; a second integrated circuit; and a silicon photonic integrated circuit to couple the first integrated circuit and the second integrated circuit. The silicon photonic integrated circuit may have a DFB laser comprising a laser including a waveguide having a variable width from a first end to a second end, the laser to generate optical energy of a plurality of lasing wavelengths.

In an example, the silicon photonic integrated circuit further comprises: a plurality of modulators, each of the plurality of modulators to modulate one of the plurality of lasing wavelengths with data; and a semiconductor optical amplifier coupled to the plurality of modulators to amplify the modulated optical data.

In an example, the system further comprises a motherboard on which the first integrated circuit, the second integrated circuit and the silicon photonic integrated circuit are adapted.

In an example, the waveguide comprises a grating pattern having a constant grating pitch, the grating pattern comprising a plurality of phase shift locations, each of the plurality of phase shift locations corresponding to a lasing wavelength.

In an example, the system further comprises a plurality of electrodes adjacent a first side of the waveguide, where each of the plurality of electrodes is to receive an independent control voltage.

In an example, the grating pattern comprises: a first portion adjacent a first side of a first phase shift location, the first portion comprising a first grating reflector for a first lasing wavelength and having a first center wavelength; and a second portion adjacent a second side of the first phase shift location, the second portion comprising a second grating reflector for the first lasing wavelength and having a second center wavelength different than the first center wavelength.

Understand that various combinations of the above examples are possible.

Note that the terms "circuit" and "circuitry" are used interchangeably herein. As used herein, these terms and the term "logic" are used to refer to alone or in any combination, analog circuitry, digital circuitry, hard wired circuitry, programmable circuitry, processor circuitry, microcontroller circuitry, hardware logic circuitry, state machine circuitry and/or any other type of physical hardware component. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. Still further embodiments may be implemented in a computer readable storage medium including information that, when manufactured into a SoC or other processor, is to configure the SoC or other processor to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EE-PROMs), magnetic or optical cards, or any other type of media suitable for storing electronic instructions.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. An apparatus, comprising:
a laser comprising a waveguide, the waveguide having a variable width from a first end to a second end, the laser to generate optical energy of a plurality of lasing wavelengths;
a plurality of modulators, each of the plurality of modulators to modulate one of the plurality of lasing wavelengths with data; and
a semiconductor optical amplifier coupled to the plurality of modulators to amplify the modulated plurality of lasing wavelengths.

2. The apparatus of claim 1, wherein the waveguide comprises a grating pattern, the grating pattern comprising a plurality of phase shift locations, each of the plurality of phase shift locations corresponding to one of the plurality of lasing wavelengths.

3. The apparatus of claim 2, wherein the grating pattern comprises a constant grating pitch.

4. The apparatus of claim 2, wherein the variable width is to cause the waveguide to have a variable effective refractive index to effect the plurality of lasing wavelengths.

5. The apparatus of claim 1, wherein the variable width comprises a linearly tapered width from the first end to the second end.

6. The apparatus of claim 1, further comprising a plurality of electrodes adjacent a first side of the waveguide, wherein each of the plurality of electrodes is to be independently controlled.

7. The apparatus of claim 6, further comprising a control circuit, wherein the control circuit is to cause an independent voltage to be provided to each of the plurality of electrodes.

8. The apparatus of claim 1, wherein the waveguide comprises:
a first portion having a first grating reflector and a second grating reflector, wherein the first grating reflector has a first center wavelength and the second grating reflector has a second center wavelength different than the first center wavelength; and
a second portion having the second grating reflector and a third grating reflector, wherein the third grating reflector has a third center wavelength different than the second center wavelength.

9. The apparatus of claim 8, wherein the first grating reflector overlaps with at least a portion of the second grating reflector.

10. A system, comprising:
a first integrated circuit comprising at least one processor;
a second integrated circuit; and
a silicon photonic integrated circuit to couple the first integrated circuit and the second integrated circuit, the silicon photonic integrated circuit having a distributed feedback (DFB) laser comprising:
a laser comprising a waveguide having a variable width from a first end to a second end, the laser to generate optical energy of a plurality of lasing wavelengths.

11. The system of claim 10, wherein the silicon photonic integrated circuit further comprises:

a plurality of modulators, each of the plurality of modulators to modulate one of the plurality of lasing wavelengths with data to form modulated optical data; and a semiconductor optical amplifier coupled to the plurality of modulators to amplify the modulated optical data.

12. The system of claim 10, further comprising a motherboard on which the first integrated circuit, the second integrated circuit, and the silicon photonic integrated circuit are adapted.

13. The system of claim 10, wherein the waveguide comprises a grating pattern having a constant grating pitch, the grating pattern comprising a plurality of phase shift locations, each of the plurality of phase shift locations corresponding to one of the plurality of lasing wavelengths.

14. The system of claim 13, further comprising a plurality of electrodes adjacent a first side of the waveguide, wherein each of the plurality of electrodes is to receive an independent control voltage.

15. The system of claim 13, wherein the grating pattern comprises:
   a first portion adjacent a first side of a first phase shift location, the first portion comprising a first grating reflector for a first lasing wavelength and having a first center wavelength; and
   a second portion adjacent a second side of the first phase shift location, the second portion comprising a second grating reflector for the first lasing wavelength and having a second center wavelength different than the first center wavelength.

16. An apparatus, comprising:
   a laser comprising a waveguide, the waveguide having a variable width from a first end to a second end, the laser to generate optical energy of a plurality of lasing wavelengths, wherein the waveguide comprises:
      a first portion having a first grating reflector and a second grating reflector, wherein the first grating reflector has a first center wavelength and the second grating reflector has a second center wavelength different than the first center wavelength; and
      a second portion having the second grating reflector and a third grating reflector, wherein the third grating reflector has a third center wavelength different than the second center wavelength.

17. The apparatus of claim 16, wherein the waveguide comprises a grating pattern comprising a constant grating pitch.

18. The apparatus of claim 16, wherein the variable width comprises a linearly tapered width from the first end to the second end.

19. The apparatus of claim 16, further comprising a plurality of electrodes adjacent a first side of the waveguide, wherein each of the plurality of electrodes is to be independently controlled.

20. The apparatus of claim 19, further comprising a control circuit, wherein the control circuit is to cause an independent voltage to be provided to each of the plurality of electrodes.

* * * * *